United States Patent [19]

Wood et al.

[11] Patent Number: 5,367,253

[45] Date of Patent: Nov. 22, 1994

[54] CLAMPED CARRIER FOR TESTING OF SEMICONDUCTOR DIES

[75] Inventors: Alan G. Wood; David R. Hembree, both of Boise; Warren M. Farnworth, Nampa, all of Id.

[73] Assignee: Micron Semiconductor, Inc., Boise, Id.

[21] Appl. No.: 46,675

[22] Filed: Apr. 14, 1993

Related U.S. Application Data

[63] Continuation-in-part of Ser. No. 973,931, Nov. 10, 1992, Pat. No. 5,302,891, which is a continuation of Ser. No. 709,858, Jun. 4, 1991.

[51] Int. Cl.$^5$ .............................................. G01R 31/02
[52] U.S. Cl. .................................. 324/158.1; 324/754
[58] Field of Search ................ 324/158 F, 158 P, 73.1, 324/72.5

[56] References Cited

U.S. PATENT DOCUMENTS

| | | | |
|---|---|---|---|
| 4,683,425 | 7/1987 | Tossutto et al. | 324/158 |
| 4,783,719 | 11/1988 | Jamison et al. | 361/398 |
| 4,899,107 | 2/1990 | Corbett et al. | 324/158 |

FOREIGN PATENT DOCUMENTS 0161171  6/1989  Japan .............................. 324/158 F

OTHER PUBLICATIONS

"IC Socket Takes Chip Carriers"; Electronics; Nov. 11, 1976; pp. 152, 154.
"Shipper-Tester-IC Flat Packs"; Azimuth Electronics, Route 10, Denville, Minn.; 1 page.
"Known-Good Die: A Key to Cost-Effective MCMs", Cloud et al., Electronic Packaging and Production, Sep. 1992.
Military SRAM Die, *Micron Military Products Data Book*, 1992, pp. 61–614.
Micron Known-Good Die Brochure.
"Our Computer Revealed, Inside the Processor" p. 139, Macworld, Oct., 1992.

*Primary Examiner*—Ernest F. Karlsen
*Attorney, Agent, or Firm*—Stanley N. Protigal; Angus C. Fox, III

[57] ABSTRACT

Disclosed is a technique for testing a singularized semiconductor die prior to packaging the die, thereby allowing for the packaging or other use of only known good die. The invention employs a carrier tray which preferably supports several die carriers which individually support a plurality of dies. Bridge clamps press against rigid covers which bias the dies against the contact members. The die carriers include a housing of ceramic or other workable material. Contact pads on the interior of the package are coupled to exterior leads with conductive traces. The back side of a semiconductor die to be tested is removably mounted to a lid, and the bond pads on the die are aligned with the contact pads on the interior of the package. The lid is attached to the package thereby electrically coupling the contact pads with the bond pads on the die. The package has a configuration which facilitates the handling of the carrier so that the carrier can be conveniently used during burn-in and test procedures.

45 Claims, 12 Drawing Sheets

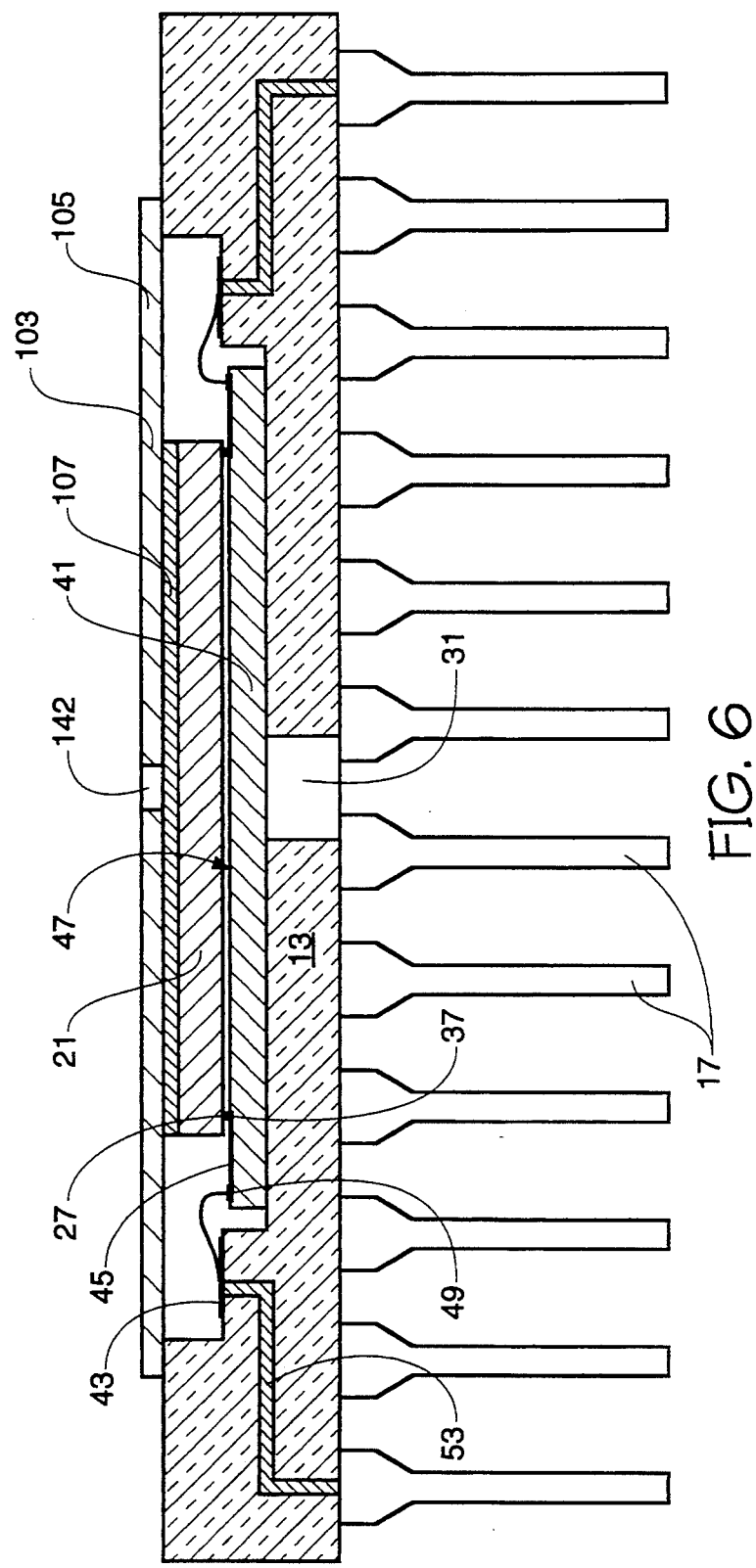

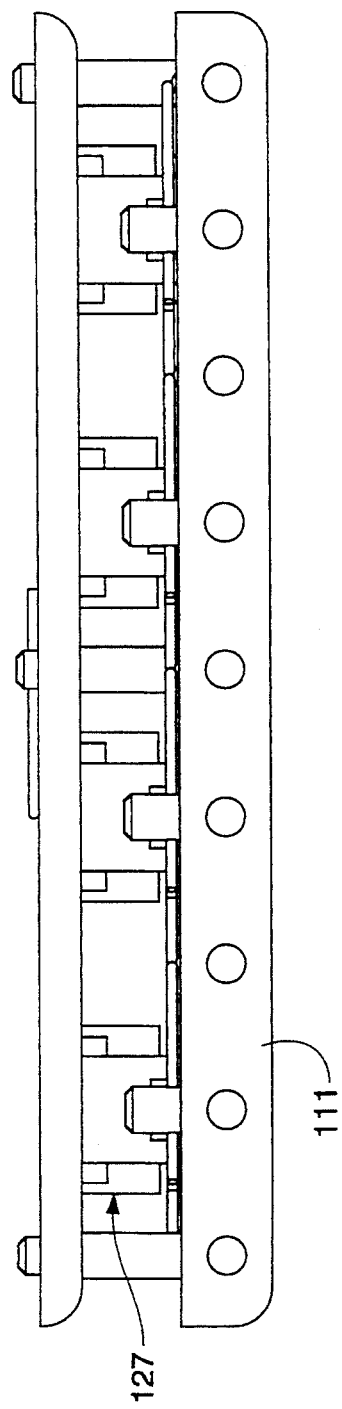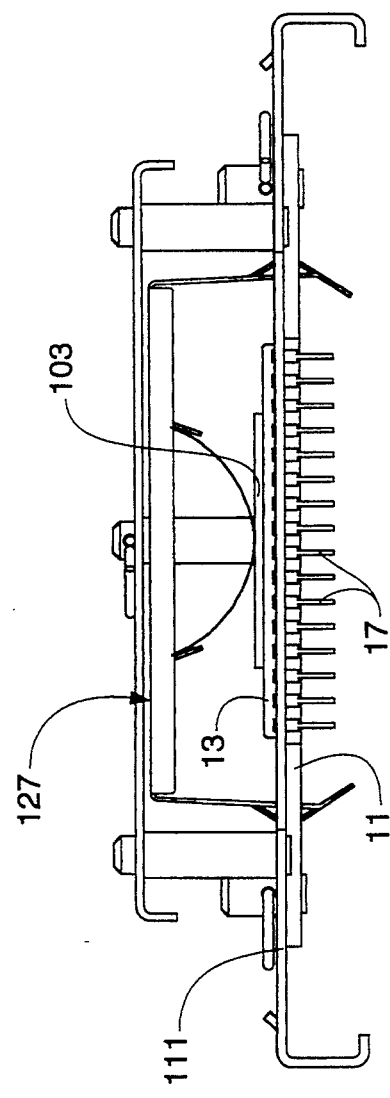

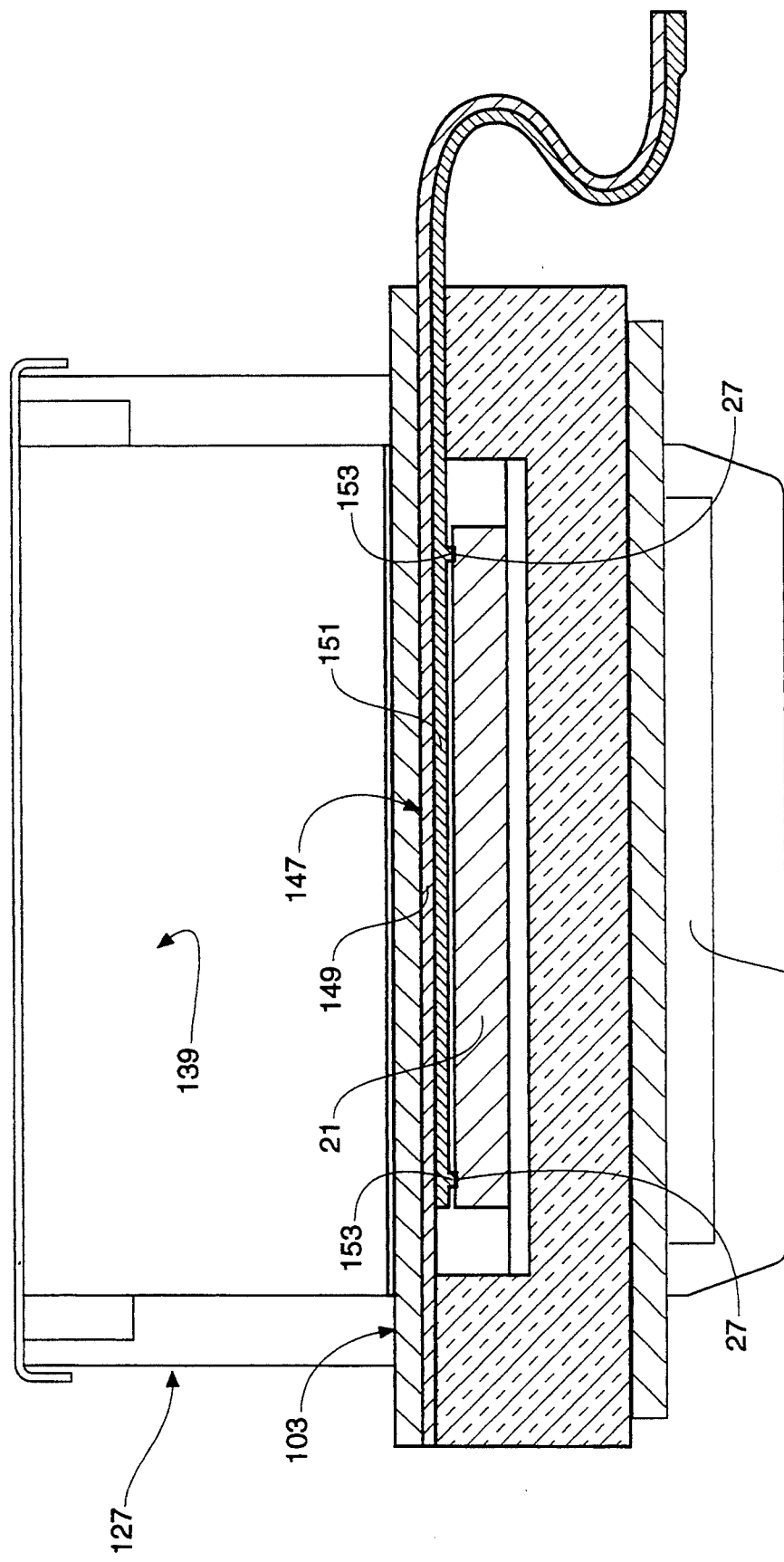

CLAMPED CARRIER FOR TESTING OF SEMICONDUCTOR DIES

CROSS-REFERENCE TO RELATED APPLICATION

This is a continuation-in-part to U.S. patent application Ser. No. 07/973,931, filed Nov. 10, 1992, now U.S. Pat. No. 5,302,891, which is a continuation of Ser. No. 07/709,858, filed Jun. 4, 1991.

FIELD OF THE INVENTION

This invention relates to the field of semiconductor device testing. More specifically, the invention relates to a technique for supporting semiconductor die in carriers during burn-in and test procedures.

BACKGROUND OF THE INVENTION

Many types of semiconductor devices are made using similar manufacturing procedures. A starting substrate, usually a thin wafer of silicon, is doped, masked, and etched through several process steps, the steps depending on the type of devices being manufactured. This process yields a number of die on each wafer produced. Each die on the wafer is given a brief test for full functionality, and the nonfunctional die are mechanically marked or mapped in software. This brief test is only a gross measure of functionality, and does not insure that a die is completely functional or has specifications that would warrant its assembly in a package.

If the wafer has a yield of grossly functional die, it indicates that a good quantity of die from the wafer are likely to be fully operative. The die are separated with a die saw, and the nonfunctional die are scrapped, while the rest are individually encapsulated in plastic packages or mounted in ceramic packages with one die in each package. After the die are packaged they are rigorously electrically tested. Components which turn out to be nonfunctional, or which operate at questionable specifications, are scrapped or devoted to special uses.

Packaging unusable die, only to scrap them after testing, is a waste of time and materials, and is therefore costly. Given the relatively low profit margins of commodity semiconductor components such as dynamic random access memories (DRAMs) and static random access memories (SRAMs), this practice is uneconomical. However, no thorough and cost effective method of testing an unpackaged die is available which would prevent this unnecessary packaging of nonfunctional and marginally functional die. Secondly, the packaging may have other limitations which are aggravated by burn-in stress conditions, so that the packaging becomes a limitation for burn-in testing.

It is proposed that multiple integrated circuit devices be packaged as a single unit, known as a multi chip module (MCM). This can be accomplished with or without conventional lead frames. This creates two problems when using conventional test methods. Firstly, discrete testing is more difficult because a conventional lead frame package is not used. Furthermore, when multiple devices are assembled into a single package, the performance of the package is reduced to that of the die with the lowest performance. Therefore, such dies are tested on an individual basis at probe, using ambient and "hot chuck" test techniques, while still in wafer form. In other words, the ability to presort the individual dice is limited to that obtained through probe testing.

In addition, there is an increased interest in providing parts which are fully characterized prior to packaging. This is desired not only because of the cost of the package, but also because there is demand for multi-chip modules (MCMs), in which multiple parts in die form are tested and assembled into a single unit. While there are various techniques proposed for testing, burning in and characterizing a singulated die, it would be advantageous to be able to "wafer map" the die prior to assembly with as many performance characteristics as possible. Ideally, one would want to be able to map the wafer with full device characterization.

MCMs create a particular need for testing prior to assembly, as contrasted to the economics of testing parts which are discretely packaged as singulated parts. For discretely packaged parts, if the product yield of good parts from preliminary testing to final shipment (probe-to-ship) is, for example, 95%, one would not be particularly concerned with packaging costs for the failed parts, if packaging costs are 10% of the product manufacturing costs. Even where packaging costs are considerably higher, as in ceramic encapsulated parts, testing unpackaged die is economical for discretely packaged parts when the added costs approximates that of cost of packaging divided by yield:

$$C_{DIE} \times \frac{C_{PACKAGE}}{Yield} = C_{DIE} \times C_{ADDL.KGD}$$

where C=cost $C_{DIE}$=manufacturing cost of functional die $C_{ADDL.KGD}$=additional cost of testing unpackaged die in order to produce known good die (KGD)

Note that in the case of discretely packaged parts, the cost of the die ($C_{DIE}$) is essentially not a factor. This changes in the case of MCMs:

$$(C_{DIE}) \times \frac{(\text{number of die})}{Yield} \times C_{PACKAGE} = C_{DIE} \times C_{ADDL.KGD}$$

Note that again $C_{DIE}$ is not a factor in modules having identical part types; however, the equation must be modified to account for varied costs and yields of die in modules with mixed part types.

With MCMs, the cost of packaging a failed part is proportional to the number of die in the module. In the case of a x16 memory array module, where probe-to-ship yield of the die is 95%, the costs are:

$$\frac{16}{0.95} \times C_{PACKAGE} = C_{ADDL.KGD}$$

so the additional costs of testing for known good die (KGD) may be 16 times the cost of testing an unrepairable module and still be economical. This, of course, is modified by the ability to repair failed modules.

Testing of unpackaged die before packaging into multichip modules would be desirable as it would result in reduced material waste, increased profits, and increased throughput. Using only known good die in MCMs would increase MCM yields significantly.

Testing unpackaged die requires a significant amount of handling. Since the test package must be separated from the die, the temporary packaging may be more complicated than either standard discrete packaging or multichip module (MCM) packaging. The package must be compatible with test and burn-in procedures, while securing the die without damaging the die at the bondpads or elsewhere during the process.

We propose an approach for testing of unpackaged die which utilizes a two piece reusable burn-in/test fixture. The fixture consists of two halves, one of which is a die cavity plate for receiving a semiconductor die as the devices under test (DUT). A die is placed in a cavity in a first half of the fixture, and a die contact member is used to establish contact with bondpads on the die, and to conduct between the bondpads and external connector leads on the fixture.

External connector leads are used, and may be provided in a preferred configuration, such as a DIP (dual inline package) or QFP (quad flat pack) configuration. The fixture establishes electrical contact with a single die and with a burn-in oven, as well as permitting testing of dice in discretely packaged form.

Such a configuration requires that the die bondpads or other contact points be aligned with contacts in the fixture. The fixture must then maintain the die in alignment without damage to the die, and particularly to the bondpads. The fixture is then manipulated through test procedures.

One advantage of the temporary package is that it need not meet the requirements of a conventional package in terms of flexibility of installation; that is, it can be cumbersome and not readily adaptable to an end use other than the test and burn-in equipment. The die is expected to be moved out of the temporary package subsequent to testing, so that the package need only be useful for the various test and burn-in procedures.

Since the temporary package is specifically intended for test and burn-in procedures, it is desired that the package be easy to assemble on a temporary basis, and thereby at least partially facilitate the test and burn-in procedures.

In U.S. Pat. No. 4,899,107, commonly assigned, a reusable burn-in/test fixture for discrete TAB die is taught. The fixture consists of two halves, one of which is a die cavity plate for receiving semiconductor dies as the units under test (UUT); and the other half establishes electrical contact with the dies and with a burn-in oven.

The first half of the test fixture contains cavities in which die are inserted circuit side up. The die will rest on a floating platform. The second half has a rigid high temperature rated substrate, on which are mounted probes for each corresponding die pad. Each of a plurality of probes is connected to an electrical trace on the substrate (similar to a P.C. board) so that each die pad of each die is electrically isolated from one another for high speed functional testing purposes. The probe tips are arranged in an array to accommodate eight or sixteen dies.

The two halves of the test fixture are joined so that each pad on each die aligns with a corresponding probe tip. The test fixture is configured to house groups of 8 or 16 die for maximum efficiency of the functional testers.

There are some testing and related procedures when the parts are singulated. For this reason, it is inconvenient, to retain multiple die in a single test fixture.

Various forms of connections are used to connect the die to a package or, in the case of a multichip module (MCM), to other connections. These include wirebonding, TAB connections, bump bonding directly to substrate, and conductive adhesives.

The bondpads are conductive areas on the face of the die which are used as an interconnect for connecting the circuitry on the die to the outside world. Normally, conductors are bonded to the bondpads, but it is possible to establish electrical contact through the bondpads by biasing conductors against the bondpads without actual bonding.

One of the problems encountered with burn in and full characterization testing of unpackaged die is the physical stress caused by connection of the bondpads to an external connection circuitry. This problem is complicated by the fact that in many die configurations, the bondpads are recessed below the surface level of a passivation layer. The passivation layer is a layer of low eutectic glass, such as BPSG, which is applied to the die in order to protect circuitry on the die. (The term "eutectic" does not, strictly speaking, apply to glass, which is an amorphous fluid; however, the term is used to describe the characteristic of some glasses wherein, as a result of their formulation, they readily flow at a given temperature.)

The ohmic contact between bondpads or test points on a die and a known good die test carrier package has been a matter of interest. It is difficult to achieve and maintain consistent ohmic contact without damaging the bondpads and passivation layer on the die. The design criteria of such contacts is somewhat different from the design criteria of the carrier package.

A prior art apparatus for packaging semiconductor devices includes a carrier tray which accepts a plurality of ceramic type packages, such as DIP (dual in-line package) or QFP (quad flat pack) packages. With the carrier supporting the package, the die is inserted, secured to the package and electrically attached to the package. A metallic lid is supported on the package by a bridge clamp which is clamped to the carrier tray over the package. The bridge clamp, in turn, clamps the lid against the package. The lid is then fused to the package, typically by soldering. The packages are then removed from the carrier tray.

SUMMARY OF THE INVENTION

According to the invention, semiconductor dies are inserted into a carrier tray and positioned so that bondpads on the dies or similar contacts on the die are in alignment with contact members. The contact members, in turn, connect the dies to external conductors. The dies are secured against movement by means of bridge clamps which extend to the carrier tray. When the dies are secured, the carrier tray is used as a test fixture in order to perform burn-in and test procedures on the dies.

In a preferred embodiment of the invention, the carrier tray supports a plurality of die carriers which individually support the dies. The bridge clamps press against a rigid cover which biases the die against the contact members. In one embodiment, the contact members are mounted to a surface which is attached to or is a part of the cover. In an alternate embodiment, the contact members are on an intermediate substrate which is located between the die and the cover. In another embodiment, the contact members are below the die, on an opposite side of the die from the cover.

The die carriers may take the form of ceramic semiconductor packages, or may be purpose-built to function as temporary test carriers.

The invention uses the carrier tray in cooperation with bridge clamps for retaining the dies in place. This enhances the stability of the connection of the dies to external connection terminals on the die carrier fixtures, since the die carrier fixtures need not be moved (or in some configurations cannot be moved) with respect to the carrier tray. The invention allows the tray which supports the bridge clamps to be used as a part of burn-in and test fixtures, thereby facilitating the burn-in and test process.

BRIEF DESCRIPTION OF THE DRAWINGS

FIG. 6 shows details of an embodiment in which an elastomeric strip is placed between a cover plate and the die;

FIG. 7A-7C show top, side and end views of an embodiment in which a boat supports a plurality of carriers which function as intermediate plates;

FIG. 10 shows TAB (tape automated bonding) tape used to establish ohmic connections with the die.

DETAILED DESCRIPTION OF THE PREFERRED EMBODIMENTS

Figure 1A:
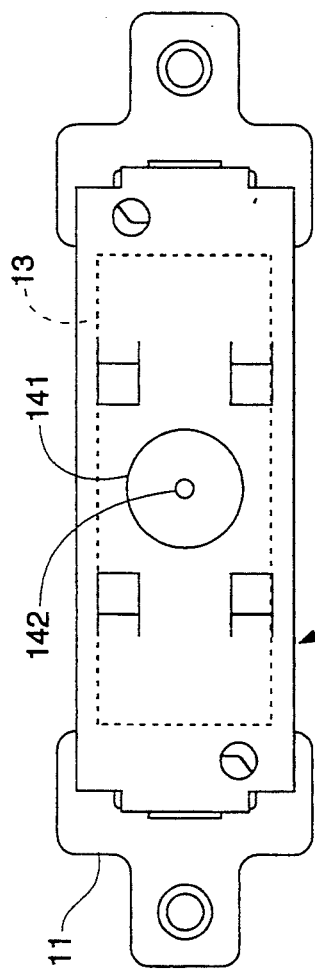
FIGS. 1A-1C show top, side and end views of an individualized carrier support and bridge clamp.
Figure 1C:
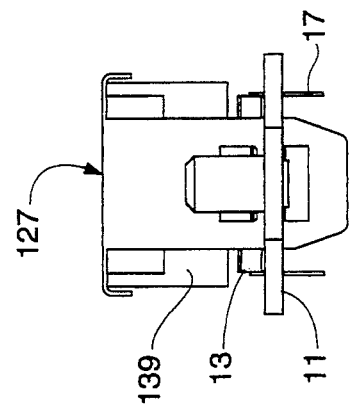
Figure 1B:
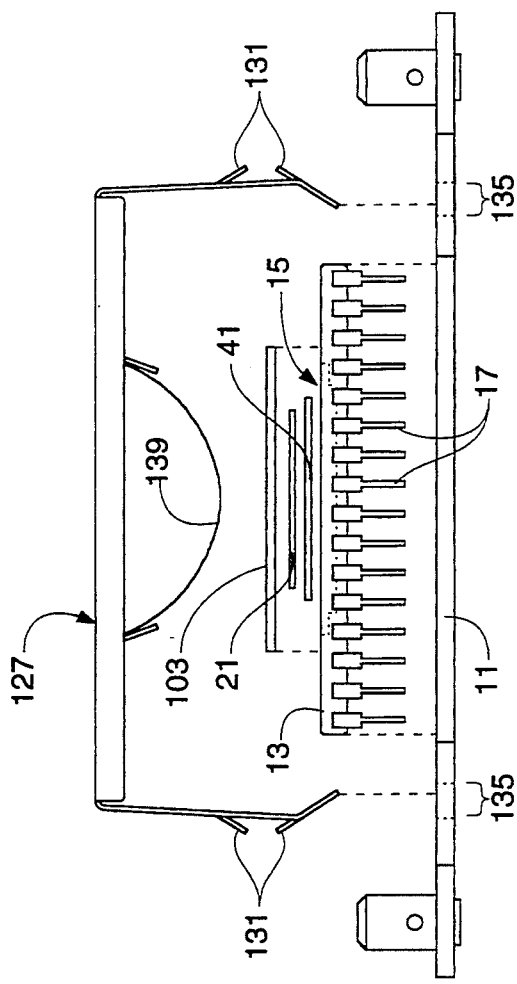

FIGS. 1A-1C show an arrangement in which a carrier tray 11 which carries a die cavity plate 13. The die cavity plate 13 has a cavity 15 therein and a plurality of external terminals 17 extending from the body 13. In the initial preferred embodiment, the die cavity plate 13 takes the configuration of a ceramic DIP (dual in line package) package. This configuration is chosen because ceramic DIP packages are commercially available.

The carrier tray 11 is adapted to support the die cavity plate 13 during a procedure in which a semiconductor integrated circuit die 21 is inserted into the die cavity plate 13 in a positional alignment within the die cavity plate 13, and temporarily connected to electrically communicate with the terminals 17.

Figure 2:
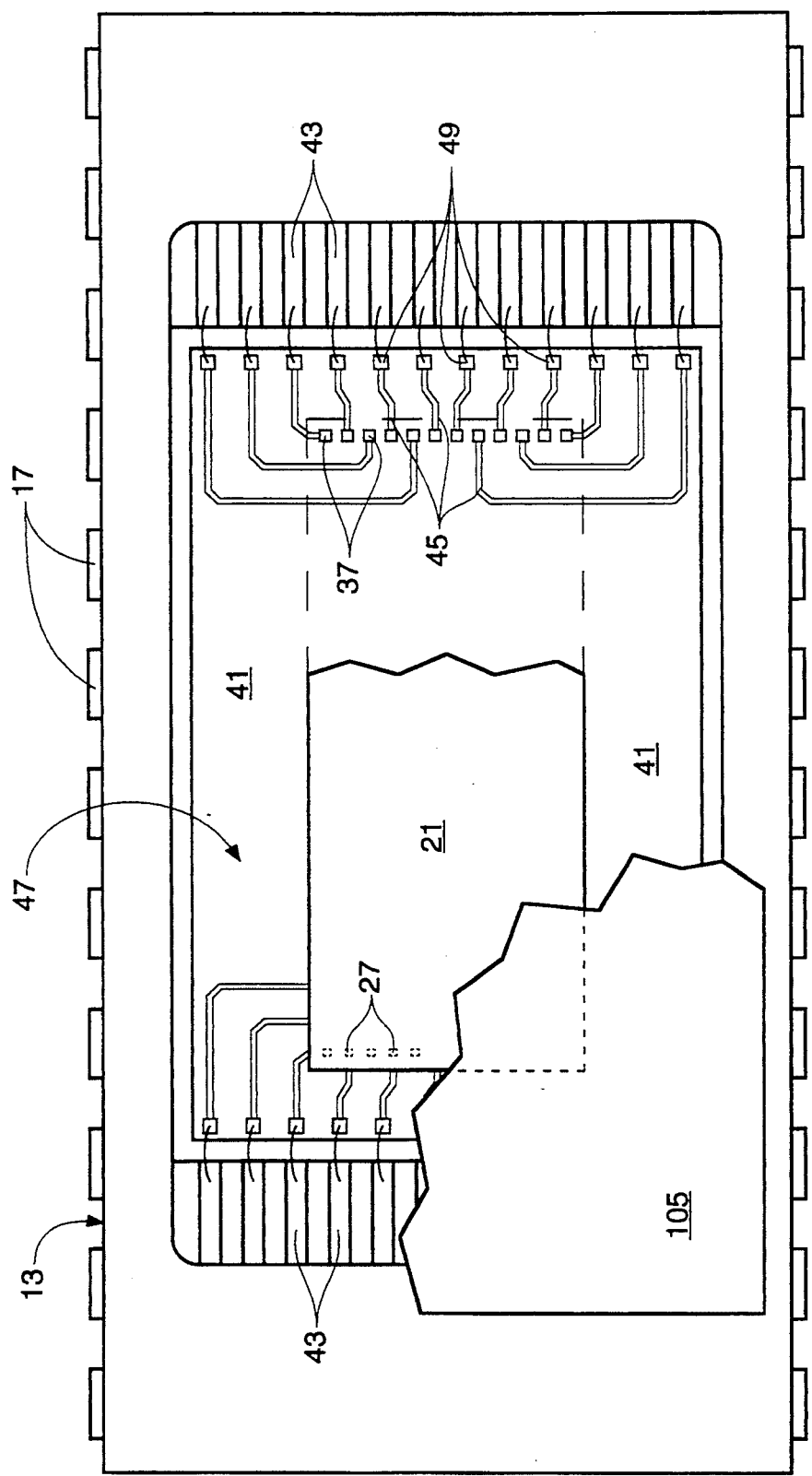
FIG. 2 shows details of a die cavity plate which houses a semiconductor die.
Figure 3:
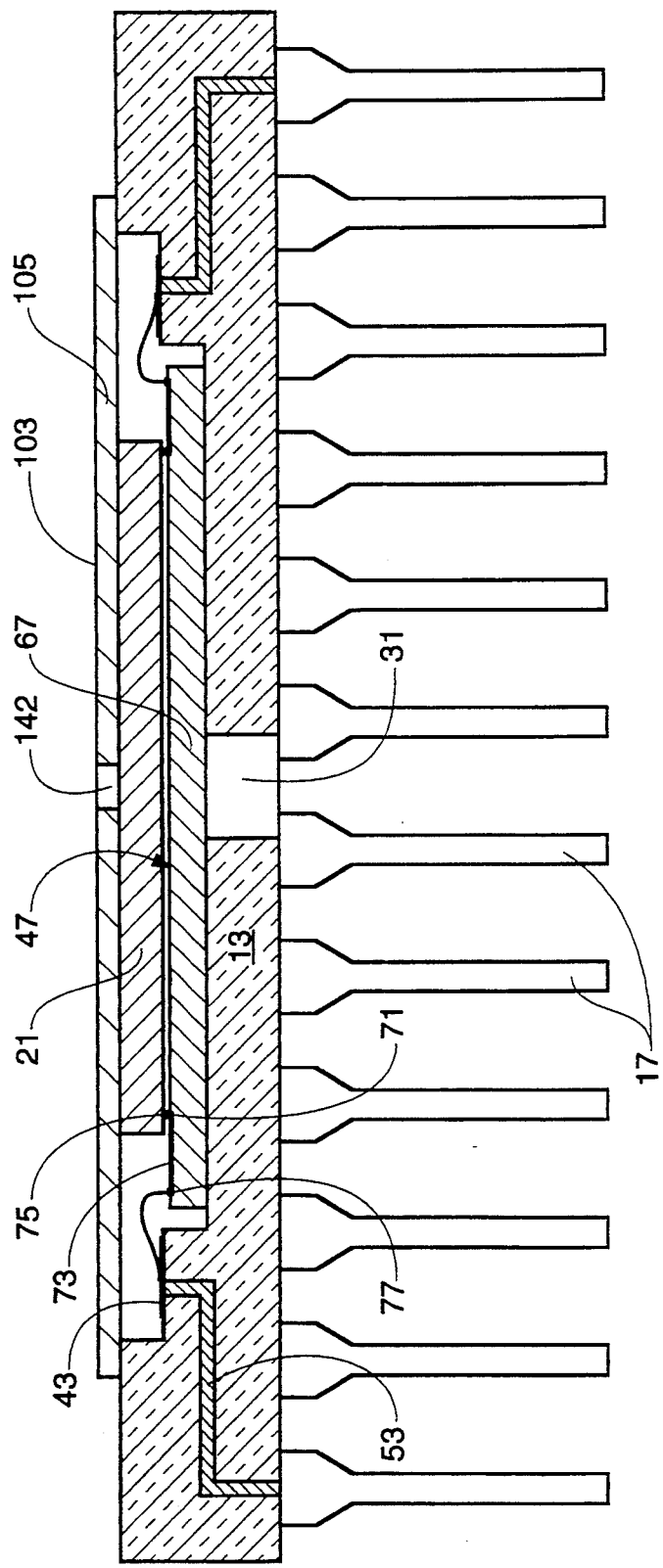
FIG. 3 shows details of a die cavity plate in which a silicon intermediate plate is used to contact a semiconductor die.

As shown in FIGS. 2-3 as well as FIGS. 1, the die receiving cavity 15 has dimensions which are at least sufficient to accommodate a die 21. The die 21 is to be connected at bondpads 27, which are typically 0.1 mm wide. The die cavity plate 13 has a slot 31 which permits convenient access to the bottom of the die 21 in order that the die 21 may be lifted out of the die receiving cavity 15.

The plurality of external terminals 17 extend from the die cavity plate 13. In the preferred embodiment, the external terminals 17 are attached to the die cavity plate 13, and extend therefrom. The external terminals 17 are shown as connector pins, which preferably are in a DIP (dual inline package) or QFP (quad flat pack) configuration. When the die cavity plate 13 is mounted to the carrier tray 11, the external terminals 17 extend past the carrier tray 11.

The external terminals 17 are secured by the die cavity plate 13 and communicate with contact pads 37 which are in approximate planar alignment with the bondpads 27.

In the preferred embodiment, as shown in FIG. 2, the contact pads 37 are on an intermediate circuit trace plate 41 which is mounted within the die cavity plate 13. The external terminals extend, within the die cavity plate 13 to a set of wirebond pads 43 on the die cavity plate 13. The intermediate circuit trace plate 41 has a plurality of circuit traces 45 on a top surface 47 of the intermediate plate 41 which extend from wirebond pads 49 (on the intermediate plate 41) to the contact pads 37.

In the preferred embodiment, the intermediate plate 41 is a ceramic substrate onto which the circuit traces 45 are deposited. It is also possible to use any other suitable interconnect, including for example flexible, rigid or semi-rigid polyimide tape.

The use of an intermediate plate 41 allows dies with different patterns of bondpads 27 to be aligned with a version of the intermediate circuit trace plate 41 custom made for that die, with several variants of the intermediate circuit trace plate 41 mating with the same die cavity plate 13.

Since the intermediate plate 41 also has the contact pads 37 thereon, the lifetime of the contact pads 37 is not directly determinative of the lifetime of the die cavity plate 13. Also, in the preferred embodiment, the external terminals 17 are electrically connected to the wirebond pads 43 by internal conductors 53. The fact that the circuit traces 45 are on the top surface 47 of the intermediate plate 41 facilitate the formation of elevated contacts on the contact pads 37, and allow the use of materials which are suitable for the formation of the elevated contacts.

In the preferred embodiment, the wirebond pads 43 on the die cavity plate 13 are wirebonded to the wirebond pads 49 on the intermediate plate 41, thereby completing a circuit from the external terminals 17 to the contact pads 37.

The die 21 is placed on the intermediate plate 41 with bondpads 27 on the die 21 aligned with the contact pads 37. Raised asperities (not shown; located at the point of contact of the contact pad 37 with the bondpads 27) are formed on the contact pads 37. In the case of a ceramic intermediate plate 41, the asperities are formed by a combination of photoplating techniques and doinking. The doinking process is described in copending U.S. patent application Ser. No. 07/898,617, filed Jun. 15, 1992, for PROCESS FOR FORMING RAISED SURFACE IRREGULARITIES BY ULTRASONIC FORGING, by Alan Wood, David Hembree and Warren Farnworth, and U.S. Pat. No. 5,249,450, for PROBEHEAD FOR ULTRASONIC FORGING, by Alan Wood, David Hembree, Larry Cromar and Warren Farnworth. It is anticipated that the intermediate plate 41 may be repeatedly used, and the contact pads 37 re-doinked between uses.

Alternatively, as shown in FIG. 3 an intermediate plate 67 may be formed of silicon or other semiconductor wafer material such as silicon on sapphire (SOS), silicon on glass (SOG) or semiconductor process materials using semiconductor materials other than silicon. In that embodiment, raised contact pads 71 may be formed by semiconductor processing techniques.

The embodiment in which the intermediate plate 67 is formed of semiconductor material has the advantage that the substrate of the intermediate plate 67 is formed from a material similar to that of the wafer. As an example, a silicon substrate for the intermediate plate 67 may be used with dies made from silicon wafers, thereby providing a coefficient of thermal expansion which matches that of the die 21. A plurality of circuit traces 73 extend from the isolating layers of the substrate and contact bondpads 75 on the die 21. The circuit traces 73 are in communication with the contact pads 71 and the wirebond pads 43 on the die cavity plate 13 are wirebonded to wirebond pads 77 on the intermediate plate 67, thereby completing a circuit from the external terminals 17 to the contact pads 71 in order to establish signal connections to perform the testing.

It is also possible to incorporate contact pads 37 directly onto the die cavity plate 13. This was not done on the initial preferred embodiment because the die cavity plate 13 was adapted from a ceramic DIP package, and it is thought that the distinct intermediate plate 41 would reduce costs of adapting to different IC part types and would facilitate the formation of the raised asperities 61.

Figure 4:
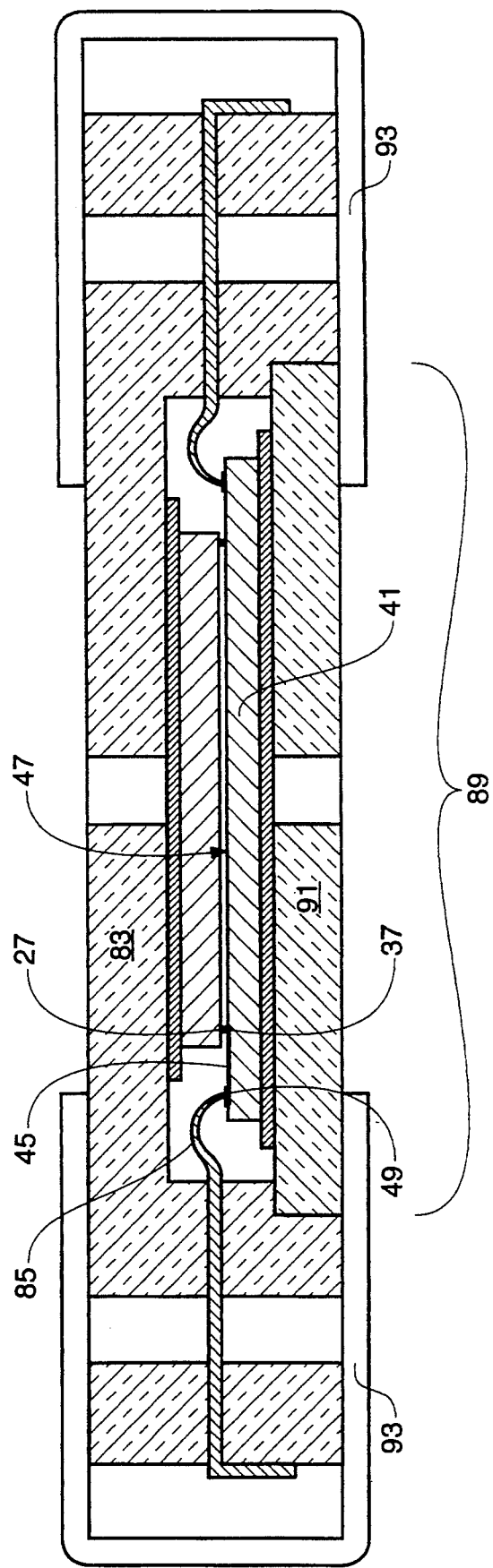
FIG. 4 shows an embodiment of the invention in which a plurality of connector bars extending from a die cavity plate contact the wirebond pads on the intermediate plate.

As shown in FIG. 4, the intermediate plate 41 may be connected to a die cavity plate 83 with a plurality of connector bars 85. The connector bars contact the wirebond pads 49. As in the embodiment of FIGS. 1-3, the wirebond pads 49 extend to the plurality of circuit traces 45 on a top surface 47 of the intermediate plate 41.

In the embodiment shown, the connector bars 85 contact the intermediate plate 41 at the top surface 47 of the intermediate plate 41. It is also possible to have the connection between the die cavity plate 83 and intermediate plate 41 at the peripheral edge of the intermediate plate. If, as shown, the contact is at the top surface 47, then the intermediate plate 41 would preferably be inserted into the die cavity plate 83 from below. An opening 89 in the die cavity plate 83 provides access to the die cavity plate 83. The intermediate plate 41 is then secured in the die cavity plate 83 by a bottom cover 91, which supports the intermediate plate 41 against the connector bars 85. The bottom cover 91 is retained in place with respect to the die cavity plate 83 by any convenient means, as represented by fasteners 93.

Figure 5A:
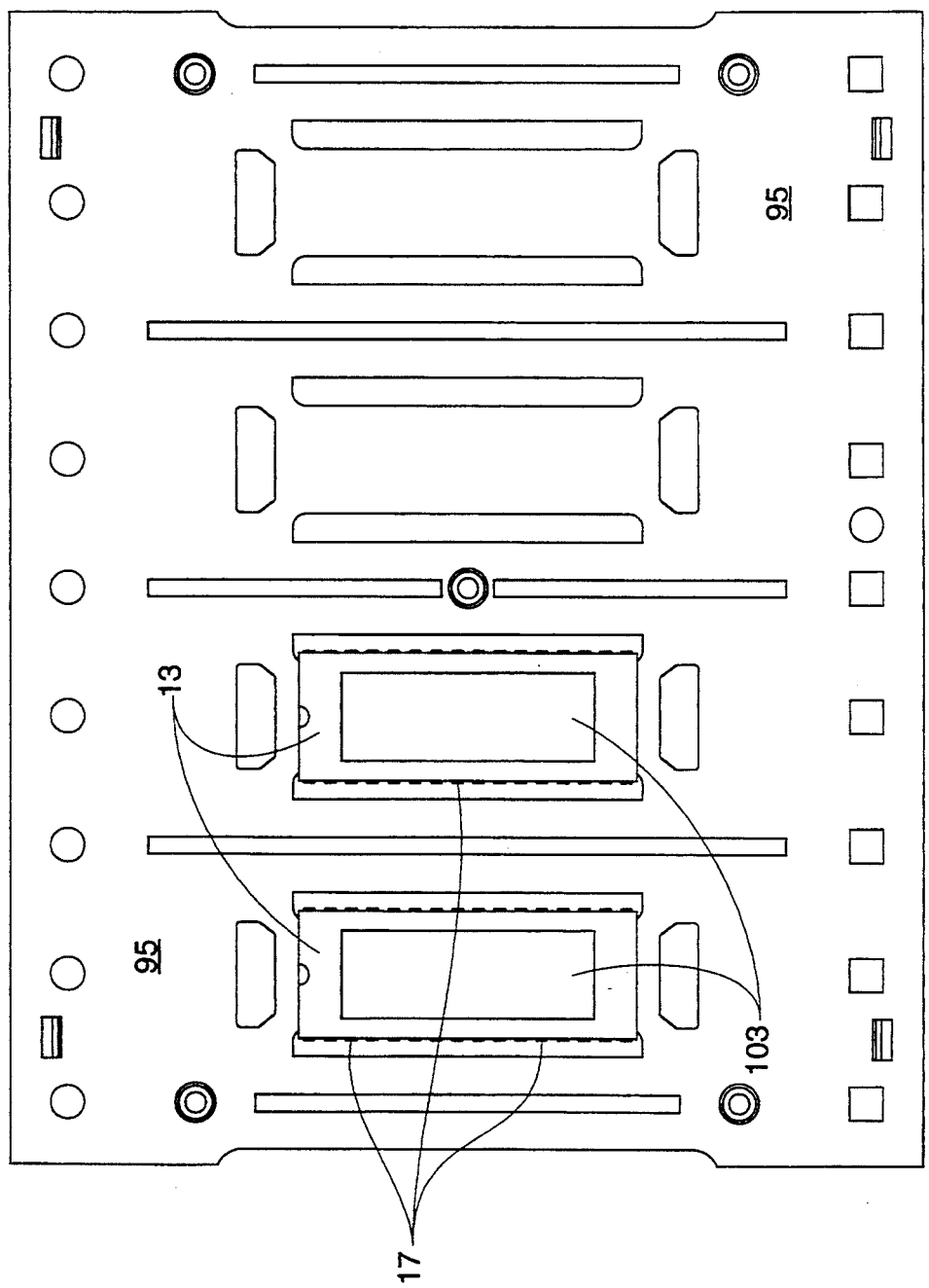
FIGS. 5A-5C show top, side and end views of the inventive carrier tray and bridge clamp.
Figure 5B:
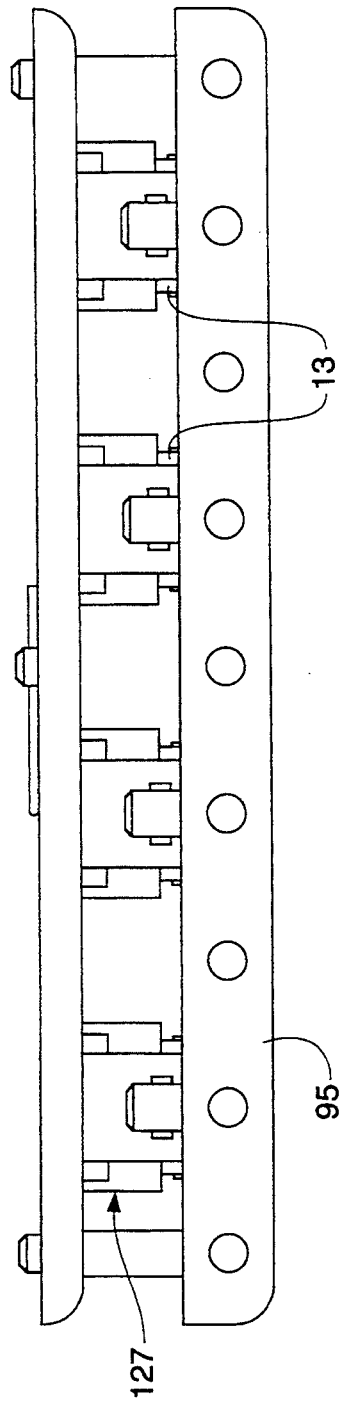
Figure 5C:
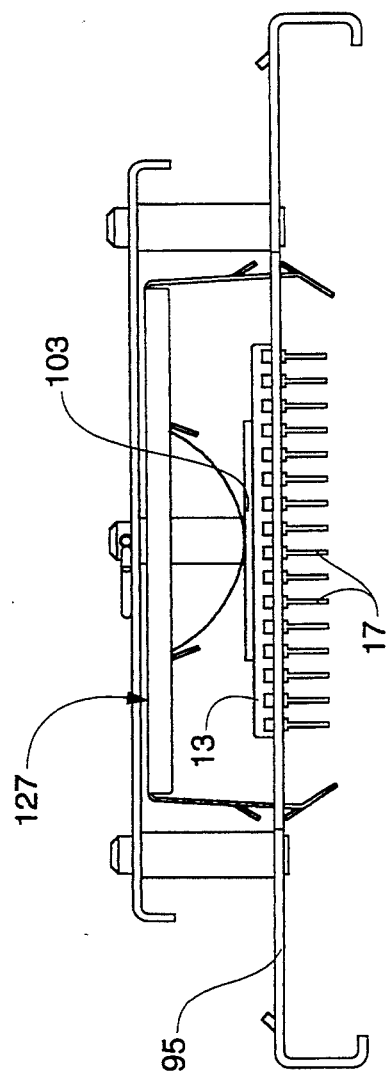

FIGS. 5A-5C show an arrangement in which a carrier tray 95 carries a plurality of die cavity plates 13. Each die cavity plate 13 has the cavity 15 and plurality of external terminals 17. As with the single carrier embodiment, the die cavity plate 13 takes the configuration of a ceramic DIP (dual in line package). This configuration also uses commercially available ceramic DIP packages.

The carrier tray 95 is adapted to support the die cavity plates 13 during a procedure in which the semiconductor integrated circuit dies 21 are inserted into the die cavity plates 13 in a positional alignment within the die cavity plates 13, and temporarily connected to electrically communicate with the terminals 17. The plurality of external terminals 17 extend from the die cavity plates 13. As can be seen, in the preferred embodiment, the external terminals 17 are attached to the die cavity plates 13, and extend therefrom. The external terminals 17 are shown as connector pins, which preferably are in a DIP (dual inline package) or QFP (quad flat pack) configuration. The external terminals 17 are secured by the die cavity plates 13 and communicate with the contact pads 37 on the die cavity plates 13, and which are in approximate planar alignment with the bondpads 27.

In the preferred embodiment, the contact pads 37 are on intermediate circuit trace plates 41. The external terminals extend, within the die cavity plates 13 to the wirebond pads 43 on the die cavity plates 13.

A cover 103 is provided for each die cavity plate 13. The cover 103 includes a rigid cover plate 105 and an optional resilient compressible elastomeric strip 107, shown in FIG. 6, which serves as a resilient biasing member. When the cover plate 105 is secured to the die cavity plate 13, the elastomeric strip 107 biases die 21 against the intermediate plate 41 or 67, thereby establishing ohmic connections between the bondpads 27 on the die 21 aligned with the contact pads 37 or 71. The elastomeric strip 107 is shown immediately subjacent the cover 103. It is also possible to locate the elastomeric strip 107 elsewhere in the carrier, such as below the intermediate plate 41.

Figure 7A:
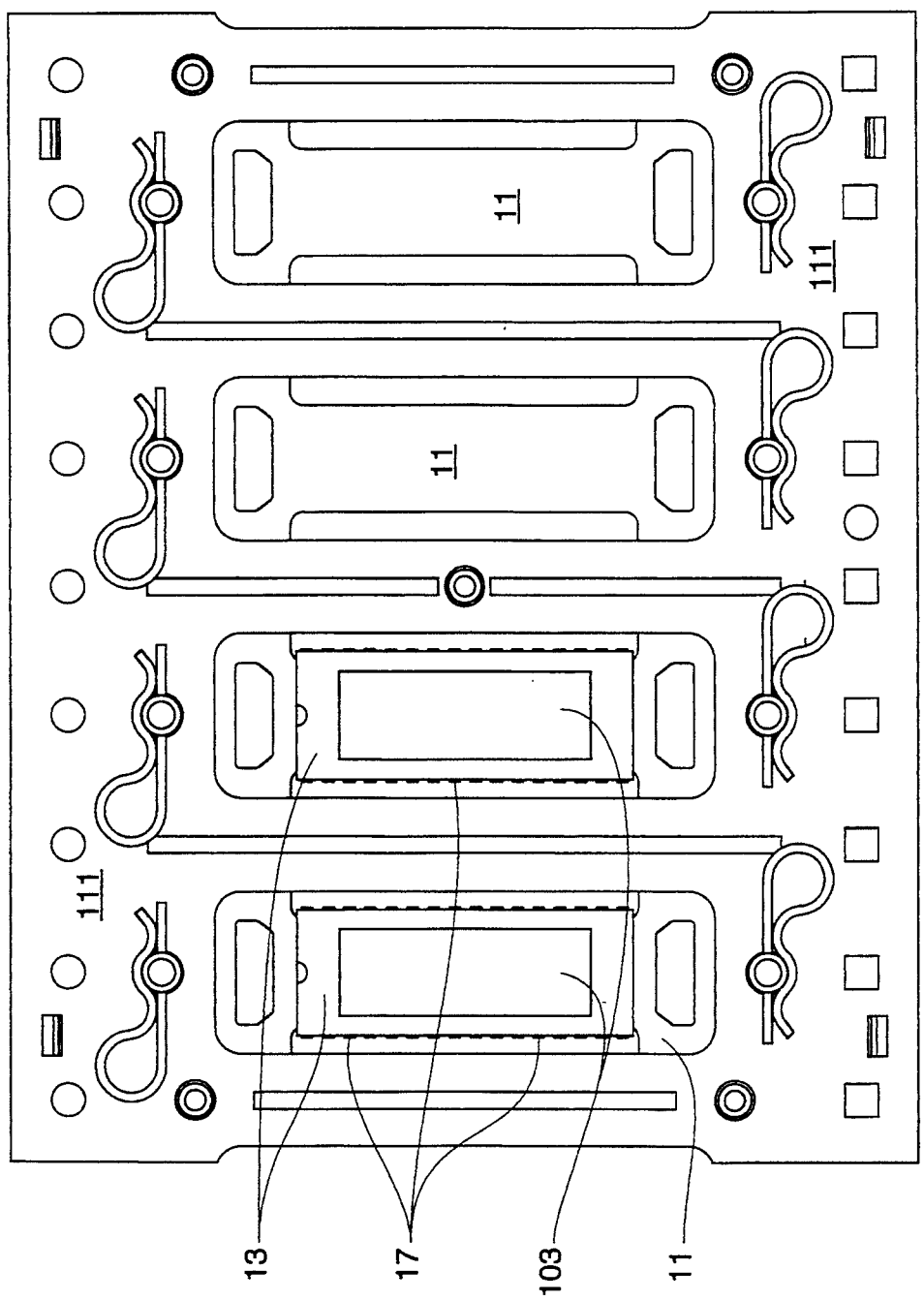

Initially, the die cavity plate 13 will be mounted to a separate carrier tray 11, as shown in FIGS. 7A-7C. The carrier separate tray may be of identical construction to that of the tray 11 shown in FIGS. 1, and in the initial embodiment of the invention, the parts are used interchangeably. The carrier tray 11 is adapted to mount to a carrier boat 111. The carrier boat 111 carries a plurality of die cavity plates 13. The carrier boat 111 and the die cavity plates 13, combined, function similarly to carrier tray 95 shown in FIG. 5.

The die receiving cavity 15 has dimensions which are at least sufficient to accommodate a die 21. The die 21 is to be connected at bondpads 27, which are typically 0.1 mm wide. The die cavity plate 13 has a slot 31 which permits convenient access to the bottom of the die 21 in order that the die 21 may be lifted out of the die receiving cavity 15.

The carrier tray 95 would probably be somewhat bulkier than the finished parts, especially where the finished parts are in multichip module (MCM) configuration. Advantageously, the tray 95 has a dimensional configuration which makes it particularly suitable for a burn-in and test environment. The spacing of the parts can be predetermined, and the carrier can provide support for handling by the test equipment.

Figure 8:
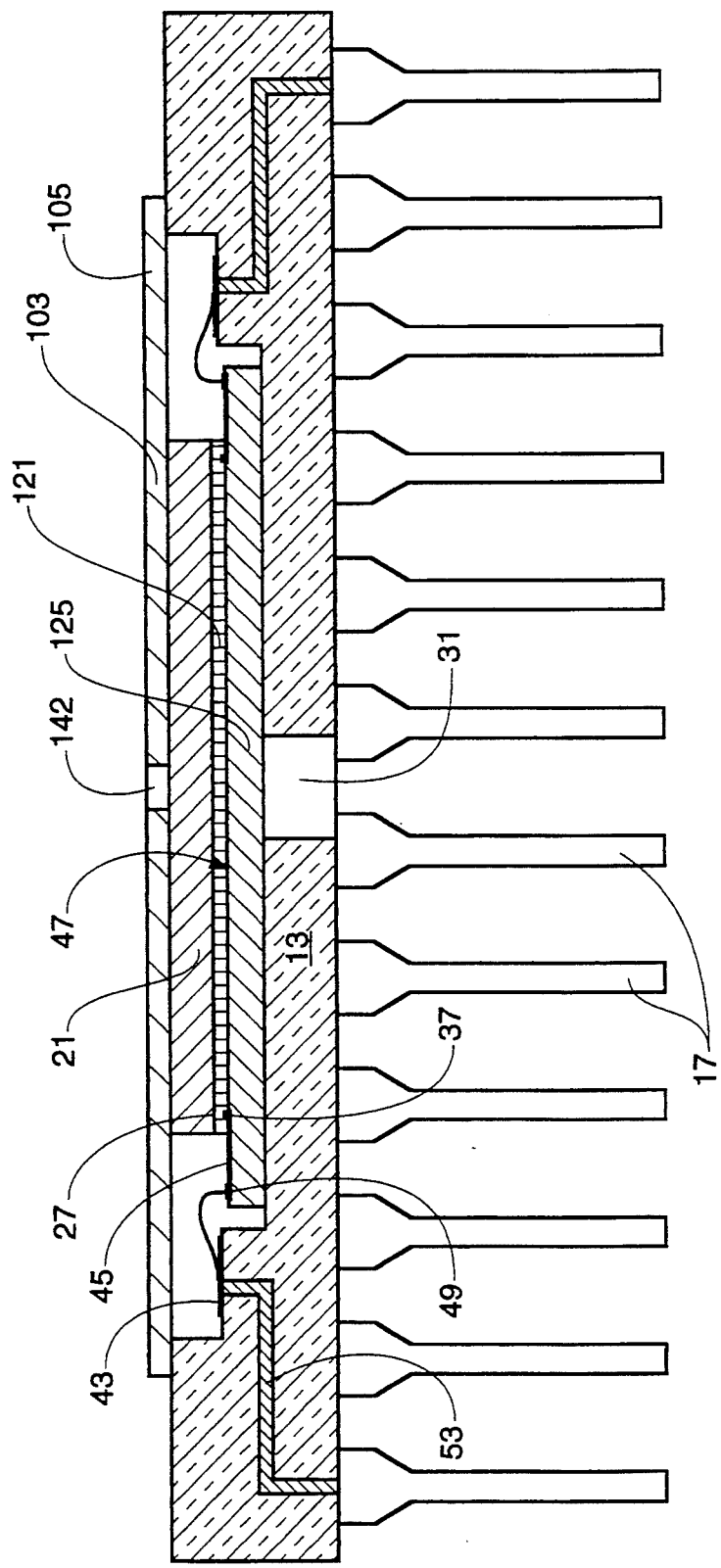
FIG. 8 shows the use of a Z-axis anisotropic interconnect material used to establish ohmic connections between the die and the contact pads on the intermediate plate.

As shown in FIG. 8, it is possible to use a Z-axis anisotropic interconnect material 121 to establish ohmic connections between the bondpads 27 on the die 21 and the contact pads 37 or 71. This establishes an ohmic contact between the bondpads 27 and the conductive traces on the TAB tape 41, without the TAB tape 41 being bonded to the bondpads 27. When the cover plate 105 is secured to the die cavity plate 13, the cover 103 biases the Z-axis anisotropic conductive interconnect material 121 against the die 21 and an intermediate plate 125. The intermediate plate 125 may be dielectric with conductive traces, such as the ceramic intermediate plate 41 described above, or a semiconductor plate, such as intermediate plate 67 described above. The elastomeric strip 107 may also be used to bias the die 21 against the Z-axis anisotropic conductive interconnect material 121.

The Z-axis anisotropic conductive interconnect material 121 is particularly useful in cases in which the bondpads 27 are recessed below a BPSG passivation layer on the die 21. Other advantages of the Z-axis anisotropic conductive interconnect material 121 result from it being easily replaced when sequentially testing different dies 21 in the same package. The Z-axis anisotropic conductive interconnect material 121 is able to elastically deform in establishing ohmic contact with the bondpads 27, so that replacement or redoinking of the intermediate plate 125 may be required less often.

In the preferred embodiment, the die 21 is secured to the cover 103 and the cover 103 is aligned with the die cavity plate 13 by optical alignment techniques known as, "flip chip bonding." Such equipment is available from Research Devices of Piscataway, N.J. The alignment system is usually used for flip chip die attachment, but functions sufficiently in the inventive capacity.

Referring again to FIGS. 1, a spring loaded bridge clamp 127 is placed over the cover 103 and is used to secure the cover 103 against the die cavity plate 13, and consequently secure the die 21 into ohmic contact with the contact pads 37 or 71, or against the Z-axis anisotropic conductive interconnect material 121. This also secures the die 21 into alignment with the contact pads, such as pads 37. The cover 103 is supported on the package by the bridge clamp 127 which is clamped to the carrier tray 11 (or 95) against the die cavity plate 13.

The clamp 127 has tab catches 131, which mate with a pair of corresponding slots 135 in the carrier tray 11. A spring 139 extends downward into interference with the cover 103 when the tab catches 131 engage the slot, thereby biasing the clamp 127 against the cover 103, and consequentially biasing the die 21 into ohmic contact to connect with the external terminals 17.

The clamp 127 is open at the top and the spring 139 has an aperture 141. The cover 103 has a corresponding hole 142 which aligns with the spring aperture 141 and permits vacuum to be applied to the die 21 during the alignment and attachment of the clamp 127 and cover 103 to the carrier tray 11 and the die cavity plate 13. The die 21 and cover 103 are mechanically aligned with the clamp 127, so that optical alignment does not take the clamp 127 out of mechanical alignment with the carrier tray 11. After the clamp 127 is engaged with the carrier tray 11, the clamp 127 may shift position, provided that the cover 103 does not also shift and cause the die 21 to shift. The contact force applied by the clamp 127 must be sufficient to push through a layer of aluminum oxide (not shown) which typically forms on aluminum bond pads 27. Penetration of the aluminum oxide layer is necessary for good electrical contact, since aluminum oxide is a poor electrical conductor. A force of about 80 grams per contact was found to be sufficient for contacts and bond pads as described above. It is anticipated that a force greater than 80 grams per contact will be applied when a silicon is used for the substrate for the intermediate plate 67. The optimum force per contact will vary according to materials of the bondpads 27 and contact pads 37, and the physical shape of the contact pads 37.

The cover 103 is a commercially available, low cost metal item. A ceramic semiconductor package lid approximately 0.01" in thickness was found to be sufficient to function as the cover 103, although any reasonable lid thickness would function sufficiently, and in the embodiment, the lid was a 0.045" thick austenitic stainless steel. Other materials may function adequately.

A coating of PTFE (Teflon TM) material is applied to the exterior side of the cover 103 in order to electrically isolate the back side of the die 21 from the clamp 127 and to facilitate relative movement of the clamp 127 and cover 103. The relative movement of the clamp 127 and the cover 103 helps to avoid causing the cover 103 to shift against the die cavity housing 13, and consequently helps avoid causing the die 21 to shift within the die cavity housing 13. A one-sided adhesive tape or a Kapton (TM, E. I. dupont de Neumours Co.) tape may be used instead of the coating of PTFE.

The hole 142 in the cover 103 aids in securing the die 21 in alignment with the cover 103 during the flip chip process. To attach the die 21 to the cover 103, a vacuum device (not shown) picks up the cover 103 with the vacuum device placed over the hole 142. The vacuum is sufficient to hold the cover 103 against the clamp 127. The die 21 is then picked up with the vacuum in an aligned contact with the cover 103. The cover 103 and die 21 were then lowered onto the intermediate plate 41, 67 or 125, thereby permitting the alignment of the bond pads with the contact pads 37 or 71. This vacuum arrangement was found to preclude the need for the adhesive polymer which was used in the previous embodiment.

Once the die 21 is secured to the cover 103 by vacuum or other means, the cover 103 is positioned over the intermediate plate 41, 67 or 125. The bond pads 27 on the die 21 are aligned with the contact pads 37 or 71 on the intermediate plate 41, 67 or 125. In the preferred embodiment, a flip chip alignment system was used to vertically align the bond pads 27 on the die 21 with the contact pads 37 or 71 on the intermediate plate 41, 67 or 125. After vertical alignment, the alignment system lowers the cover 103. This results in ohmic contact the bond pads 27 on the die 21 with the contact pads 37 or 71 on the intermediate plate 41, 67 or 125. The contact force must be sufficient to push the contact pads 37 or 71 through the layer of aluminum oxide (not shown) which typically forms on the aluminum bond pads 27. If necessary, penetration of the aluminum oxide layer is effected as described above.

Figure 9:
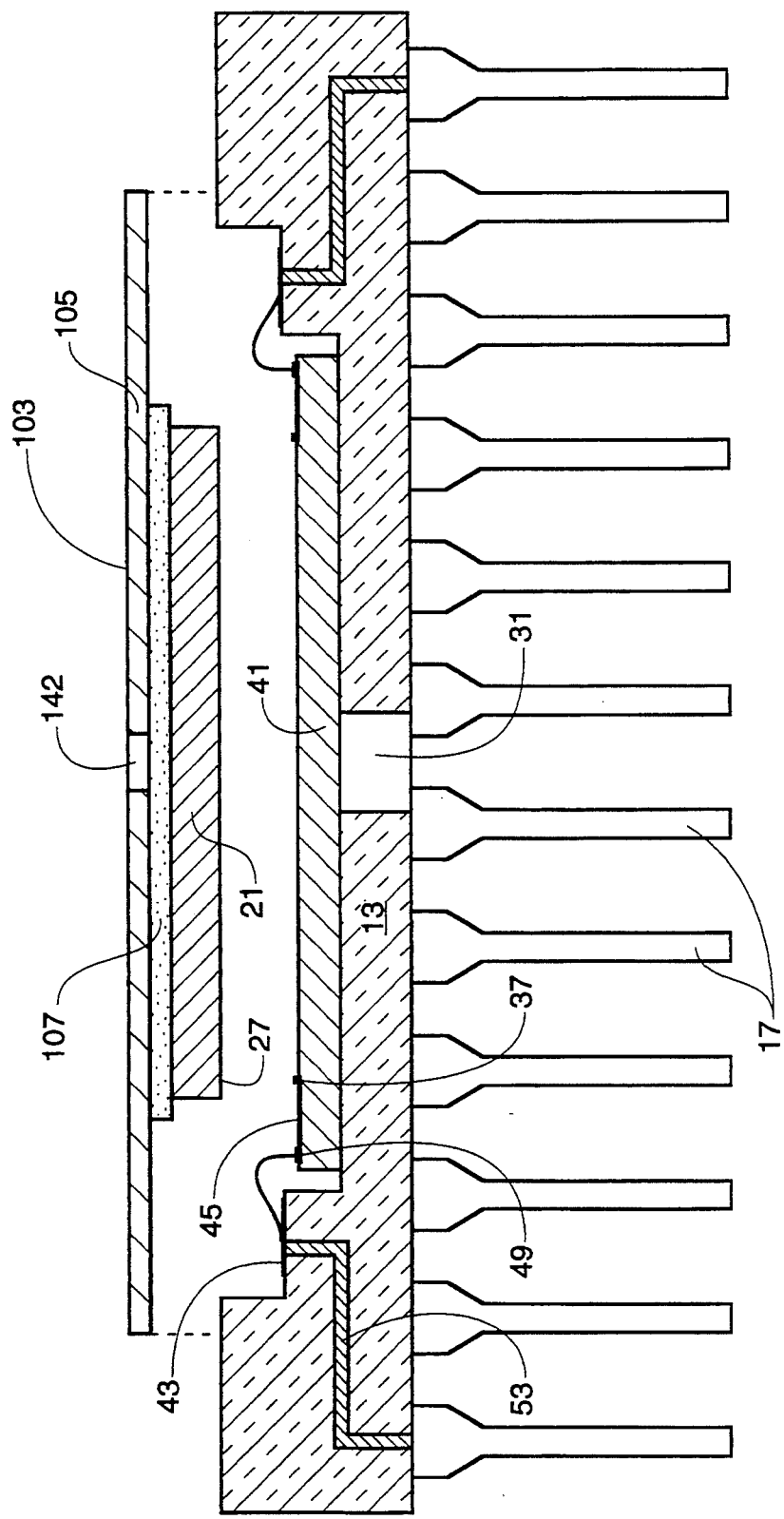
FIG. 9 shows the use of a silicone strip used to secure the die to cover.

An alternative technique for temporarily securing the die 21 in place for positioning in the die cavity plate 13 is shown in FIG. 9. A precured RTV silicone strip, commonly known as "gel pack," is used as an elastomeric strip 107. The elastomeric strip 107 is fixed to a part of the carrier, such as the cover 103 shown in FIG. 9. The silicone elastomeric strip 107 exhibits a static charge sufficient and coefficient of friction sufficient to hold the die 21 in place without adhesive, and also is elastomeric. The silicone holds the silicon in place and biases the silicon against the intermediate plate 41 or 67 when the clamp 127 secures the cover 103 to the die cavity housing plate 13.

Referring to FIG. 10, TAB (tape automated bonding) tape 147 is used to extend between the contact pads 37 on the die cavity plate 13 and the bondpads 27.

The TAB tape 147 includes a plastic film 149, preferably formed of polyimide, onto which are formed a plurality of conductive traces 151. The conductive traces 151 have bumps 153 which are intended for registration with a bondpad 27. The conductive traces 151 therefore are able to conduct signals between the bondpads 27, provided that ohmic contact is established between the bondpads 27 and the respective bumps 153.

Once the die 21 is mounted within the die cavity plate 13, the die 21 may be burned in and tested in a manner similar to burn-in and test of ordinary singulated packaged dies. This testing includes thermal testing from at least 15° C. to 125° C. It is more likely that testing will take place at temperature ranges of from −10° C. to 125° C. In the case of some military or adverse condition rated semiconductor parts, testing would occur at a range of from −55° C. to 150° C.

Clearly, other embodiments of the invention are possible and are anticipated. As an example, the carrier tray may be monolithic with the die cavity plates. Accordingly, the invention should be considered limited only by the claims.

What is claimed is:

1. A method for testing bare semiconductor die, comprising:
   a) providing a carrier tray, said tray having at least one housing location therein, and having a property of remaining substantially intact from −55° C. to 175° C.;
   b) providing at least one die receiving housing on said tray, each of said die receiving housing comprising a die receiving cavity, an electrical termination, and conductive traces, said traces forming an electrical pathway between said cavity and said electrical termination;
   c) providing a bare semiconductor die in said housing as a device under test;
   d) providing a lid portion to cooperate with each of said die receiving housings, wherein said lid portion and said die receiving housing form first and second opposing members;
   e) providing a clamping member and using the clamping member to clamp the lid portion to the die receiving housings, the clamping member engaging said carrier tray to secure the lid portion against the die receiving housing and further securing the die within said die receiving housing in electrical communication with said conductive traces;
   f) performing burn-in and characterization tests on the die while the lid portion is secured against the die receiving housing; and
   g) removing the die from the die receiving housing.

2. Method as described in claim 1, further characterized by:
   providing said lid portion as a unitary lid for a plurality of said die receiving housings.

3. Method as described in claim 1, further characterized by:
   providing said lid portion as a separate lid for each of said die receiving housings.

4. Method as described in claim 1, further characterized by:
   providing an interconnect member, the interconnect member containing at least a portion of said conductive traces, and the interconnect member further being in contact with electrical connections on the semiconductor die when the lid portion is secured against the die receiving housing.

5. The method of claim 1 wherein said lid has a hole therein, and said die is secured to said lid with a vacuum force through said hole to said lid.

6. The method as described in claim 1, further characterized by:
   removably bonding the die to the die receiving housing prior to said clamping the lid portion.

7. Method as described in claim 6, further characterized by:
   providing said lid portion as a separate lid for each of said die receiving housings.

8. The method as described in claim 1, further characterized by:
   a) providing said lid portion as a separate lid for each of said die receiving housings;
   b) the die being removably secured to the lid prior to said clamping the lid portion; and
   c) aligning the lid portion, with the die secured to the lid portion, so as to align the die within the die receiving housing in said electrical communication with said conductive traces.

9. The method of claim 8 wherein said lid has a hole therein, and said die is secured to said lid with a vacuum force through said hole to said lid.

10. The method as described in claim 1, further characterized by:
    the die being removably secured to the die receiving housing prior to said clamping the lid portion.

11. The method as described in claim 1, further characterized by:
    removably bonding the die to the die receiving housing prior to said clamping the lid portion.

12. The method as described in claim 1, further characterized by:
    providing a pad to bias the die against said conductive traces, said pad being elastically resilient, thereby biasing against the die received in the die receiving cavity with the contacts after the first and second plates have been mated.

13. The method as described in claim 1, further characterized by:
    providing a carrier tray with a property of remaining substantially intact from −10° C. to 125° C.

14. A method for testing bare semiconductor die, comprising:
    a) providing a carrier tray, said tray having at least one housing location therein;
    b) providing at least one die receiving housing on said tray, each die receiving housing comprising a die receiving cavity, an electrical termination, and conductive traces, said traces forming an electrical pathway between said cavity and said electrical termination;
    c) providing a bare semiconductor die in said housing as a device under test;
    d) providing a lid portion to cooperate with each of said die receiving housings, wherein said lid portion and said die receiving housing form first and second opposing members;
    e) providing an interconnect having a plurality of conductive traces thereon;
    f) attaching said die to said interconnect such that said traces on said interconnect electrically couple said bond pads with said conductive traces;
    g) providing a clamping member, the clamping member engaging said carrier tray to secure the lid portion against the die receiving housing and further securing the die within said die receiving housing in electrical communication with said conductive traces;
    h) electrically analyzing the die for adherence to predetermined specifications;
    i) separating said lid from said housing and removing said die from said housing.

15. The method as described in claim 14, further characterized by:
    a) placing said interconnect in said die receiving housing and connecting said interconnect to the conductive traces on the die receiving housing;
    b) placing said die on said interconnect so as to align said traces on said interconnect to electrically couple said bond pads with said conductive traces; and
    c) placing said lid over said die, with the die being interposed between said lid and said interconnect.

16. The method as described in claim 15, further characterized by:

a) providing said lid portion as a separate lid for each of said die receiving housings;
b) the die being removably secured to the lid prior to said clamping the lid portion; and
c) aligning the lid portion, with the die secured to the lid portion, so as to align the die within the die receiving housing in said electrical communication with said traces on said interconnect.

17. The method as described in claim 14, further characterized by:
a) removably bonding the die to the die receiving housing prior to said clamping the lid portion; and
b) subsequent to testing the die, removing from said first opposing member after testing.

18. The method of claim 14 wherein said lid has a hole therein, and said die is secured to said lid with a vacuum force through said hole to said lid.

19. The method as described in claim 14, further characterized by:
removably bonding the die to the die receiving housing prior to said clamping the lid portion.

20. Method as described in claim 19, further characterized by:
providing said lid portion as a separate lid for each of a plurality of said die receiving housings.

21. The method as described in claim 14, further characterized by:
a) providing said lid portion as a separate lid for each of said die receiving housings;
b) the die being removably secured to the lid prior to said clamping the lid portion; and
c) aligning the lid portion, with the die secured to the lid portion, so as to align the die within the die receiving housing in said electrical communication with said conductive traces.

22. The method of claim 21 wherein said lid has a hole therein, and said die is secured to said lid with a vacuum force through said hole to said lid.

23. The method as described in claim 14, further characterized by:
the die being removably secured to the die receiving housing prior to said clamping the lid portion.

24. The method as described in claim 14, further characterized by:
removably bonding the die to the die receiving housing prior to said clamping the lid portion.

25. The method as described in claim 14, further characterized by:
providing a pad to bias the die against said conductive traces, said pad being elastically resilient, thereby biasing against the die received in the die receiving cavity with the contacts after the first and second plates have been mated.

26. Method as described in claim 4, further characterized by:
providing said interconnect member as a separate unit from the die receiving housing, thereby allowing dies with different patterns of bondpads to be aligned with a version of said interconnect member custom made for that die, with several variants of said interconnect member being mating with the same die cavity plate, thereby facilitating said performing burn-in and characterization tests on the die by permitting the same die receiving housing to be used with said dies with different patterns of bondpads.

27. Method as described in claim 14, further characterized by:
providing said interconnect as a separate unit from the die receiving housing, thereby allowing dies with different patterns of bondpads to be aligned with a version of said interconnect custom made for that die, with several variants of said interconnect being mating with the same die cavity plate, thereby facilitating said electrical analysis by permitting the same die receiving housing to be used with said dies with different patterns of bondpads.

28. A method for testing bare semiconductor die, comprising:
a) providing a carrier tray, said tray having at least one housing location therein;
b) providing at least one die receiving housing on said tray, each of said die receiving housing comprising a die receiving cavity, an electrical termination, a plurality of electrical contacts in the cavity for engaging contact points on the die and conductive traces, said traces forming an electrical pathway between said electrical contacts and said electrical termination;
c) providing a bare semiconductor die in said housing as a device under test;
d) providing a lid portion to cooperate with each of said die receiving housings, wherein said lid portion and said die receiving housing form first and second opposing members;
e) providing a clamping component which comprises a flexible biasing member, and using the clamping component to clamp the lid portion to the die receiving housings, the clamping component engaging said carrier tray to secure the lid portion against the die receiving housing and further securing the die within said die receiving housing in electrical communication with said conductive traces, the flexible biasing member resulting in the clamping component cooperating with the lid portion to bias the die within the die receiving housings into contact with said traces, said biasing of the die being normal to a major surface of the die, so that said clamping of the lid portion to the die receiving housing results in a force applied between the die and the electrical contacts which is sufficient to establish ohmic contact with contact points on the die and the electrical contacts;
f) performing burn-in and characterization tests on the die while the lid portion is secured against the die receiving housing; and
g) removing the die from the die receiving housing.

29. Method as described in claim 28, further characterized by:
positioning said biasing member so as to extend from a substantially rigid portion of the clamping component and supported by a tab on the rigid portion, the biasing member being interspaced between the substantially rigid portion and the lid portion, wherein said biasing member exerts its force against the lid portion when the clamping component is engaging said carrier tray.

30. Method as described in claim 28, further characterized by providing said biasing member as a leaf spring.

31. Method as described in claim 28, further characterized by:
providing said lid portion as a unitary lid for a plurality of said die receiving housings.

32. Method as described in claim 28, further characterized by:

providing said lid portion as a separate lid for each of said die receiving housings.

33. Method as described in claim 28, further characterized by:

providing an interconnect member, the interconnect member containing at least a portion of said conductive traces, and the interconnect member further including said plurality of electrical contacts, said plurality of electrical contacts on said interconnect member being in contact with said contact points when the lid portion is secured against the die receiving housing.

34. Method as described in claim 33, further characterized by:

providing said interconnect member as a separate unit from the die receiving housing, thereby allowing dies with different patterns of bondpads to be aligned with a version of said interconnect member custom made for that die, with several variants of said interconnect member being mating with the same die cavity plate, thereby facilitating said performing burn-in and characterization tests on the die by permitting the same die receiving housing to be used with said dies with different patterns of bondpads.

35. The method of claim 28 wherein said lid has a hole therein, and said die is secured to said lid with a vacuum force through said hole to said lid.

36. The method as described in claim 28, further characterized by:

providing said lid portion as a separate lid for each of said die receiving housings.

37. The method as described in claim 28, further characterized by:

a) providing said lid portion as a separate lid for each of said die receiving housings;
b) the die being removably secured to the lid prior to said clamping the lid portion; and
c) aligning the lid portion, with the die secured to the lid portion, so as to align the die within the die receiving housing in said electrical communication with said plurality of electrical contacts.

38. The method of claim 37 wherein said lid has a hole therein, and said die is secured to said lid with a vacuum force through said hole to said lid.

39. The method as described in claim 28, further characterized by:

removably bonding the die to the die receiving housing prior to said clamping the lid portion.

40. The method as described in claim 28, further characterized by:

providing a pad to bias the die against said conductive traces, said pad being elastically resilient, thereby biasing against the die received in the die receiving cavity with the contacts after the first and second plates have been mated.

41. The method as described in claim 28, further characterized by:

providing a carrier tray with a property of remaining substantially intact from −10° C. to 125° C.

42. The method as described in claim 28, further characterized by:

providing a carrier tray with a property of remaining substantially intact from −55° C. to 175° C.

43. A method for testing bare semiconductor die, comprising:

a) providing a carrier tray, said tray having at least one housing location therein;
b) providing at least one die receiving housing on said tray, each of said die receiving housing comprising a die receiving cavity and an electrical termination;
c) providing an interconnect in the die receiving cavity, the interconnect having a plurality of conductive traces thereon, a plurality of electrical contacts for engaging contact points on the die, said traces forming an electrical pathway between said electrical contacts and said electrical termination;
d) providing a bare semiconductor die in said housing as a device under test;
e) providing a lid portion to cooperate with each of said die receiving housings, wherein said lid portion and said die receiving housing from first and second opposing members;
f) providing a clamping component which comprises a flexible biasing member, and using the clamping component to clamp the lid portion to the die receiving housings, the clamping component engaging said carrier tray to secure the lid portion against the die receiving housing and further securing the die within said die receiving housing in electrical communication with said conductive traces, the flexible biasing member resulting in the clamping component cooperating with the lid portion to bias the die within the die receiving housings into contact with said traces, said biasing of the die being normal to a major surface of the die, so that said clamping of the lid portion to the die receiving housing results in a force applied between the die and the electrical contacts which is sufficient to establish ohmic contact with contact points on the die and the electrical contacts;
g) electrically analyzing the die for adherence to predetermined specifications; and
h) removing the die from the die receiving housing.

44. Method as described in claim 43, further characterized by:

providing said interconnect as a separate unit from the die receiving housing, thereby allowing dies with different patterns of bondpads to be aligned with a version of said interconnect custom made for that die, with several variants of said interconnect being mating with the same die cavity plate, thereby facilitating said electrical analysis by permitting the same die receiving housing to be used with said dies with different patterns of bondpads.

45. Method as described in claim 43, further characterized by:

positioning said biasing member so as to extend from a substantially rigid portion of the clamping component and supported by a tab on the rigid portion, the biasing member being interspaced between the substantially rigid portion and the lid portion, wherein said biasing member exerts its force against the lid portion when the clamping component is engaging said carrier tray.

* * * * *